US011570391B2

(12) United States Patent
Bohannon

(10) Patent No.: US 11,570,391 B2
(45) Date of Patent: Jan. 31, 2023

(54) DIGITALLY-CALIBRATED CTIA IMAGE SENSOR PIXEL

(71) Applicant: Sony Semiconductor Solutions Corporation, Kanagawa (JP)

(72) Inventor: Eric Bohannon, Henrietta, NY (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 86 days.

(21) Appl. No.: 17/122,249

(22) Filed: Dec. 15, 2020

(65) Prior Publication Data

US 2022/0191423 A1 Jun. 16, 2022

(51) Int. Cl.
*H04N 5/374* (2011.01)
*H04N 5/378* (2011.01)
*H01L 27/146* (2006.01)
*H04N 5/3745* (2011.01)

(52) U.S. Cl.
CPC ... *H04N 5/37457* (2013.01); *H01L 27/14612* (2013.01); *H01L 27/14636* (2013.01); *H01L 27/14643* (2013.01)

(58) Field of Classification Search
CPC .. H04N 5/37457; H04N 5/378; H04N 5/3745; H04N 5/374; H01L 27/14612; H01L 27/14636; H01L 27/14643
See application file for complete search history.

(56) References Cited

U.S. PATENT DOCUMENTS

| | | | |
|---|---|---|---|
| 5,376,813 A | 12/1994 | Delbruck et al. | |
| 5,892,540 A * | 4/1999 | Kozlowski | H04N 5/217 |
| | | | 348/300 |
| 9,936,150 B2 * | 4/2018 | Hynecek | H04N 5/335 |
| 11,356,622 B1 * | 6/2022 | Kean | H04N 5/3594 |
| 2003/0058047 A1 | 3/2003 | Sakurai | |
| 2003/0184459 A1 * | 10/2003 | Engl | H03M 1/10 |
| | | | 341/112 |
| 2004/0046101 A1 * | 3/2004 | Nakamura | H01L 27/14643 |
| | | | 250/200 |
| 2005/0285678 A1 | 12/2005 | Kaviani et al. | |
| 2007/0096786 A1 | 5/2007 | Hsieh | |

(Continued)

FOREIGN PATENT DOCUMENTS

EP 0813338 A2 12/1997

OTHER PUBLICATIONS

International Search Report and Written Opinion dated Nov. 17, 2021 for corresponding International Application No. PCT/US2021/045558.

*Primary Examiner* — Marly S Camargo
(74) *Attorney, Agent, or Firm* — Michael Best & Friedrich LLP

(57) ABSTRACT

A pixel circuit includes a photoelectric conversion device; an amplifier including a first amplifier transistor and a second amplifier transistor connected in series between a first voltage and a second voltage, wherein a gate terminal of the first amplifier transistor is connected to the photoelectric conversion device; a feedback capacitor connected between a first current terminal of the first amplifier transistor and the photoelectric conversion device; a first reset switch connected between the gate terminal of the first amplifier transistor and an anode voltage; and a second reset switch connected between a first current terminal of the second amplifier transistor and a gate terminal of the second amplifier transistor.

20 Claims, 5 Drawing Sheets

(56) References Cited

U.S. PATENT DOCUMENTS

| | | | |
|---|---|---|---|
| 2010/0176275 A1* | 7/2010 | Vampola | H04N 5/3745 250/214 A |
| 2011/0234876 A1 | 9/2011 | Leconte | |
| 2013/0194122 A1 | 8/2013 | Sarraj et al. | |
| 2019/0268557 A1* | 8/2019 | Kawahito | H03M 1/144 |
| 2020/0067469 A1* | 2/2020 | Li | H03F 3/45475 |
| 2020/0169681 A1* | 5/2020 | Stobie | H04N 5/05 |
| 2020/0186734 A1* | 6/2020 | Nagawa | H04N 5/379 |
| 2020/0396403 A1* | 12/2020 | Ebihara | H04N 5/378 |

* cited by examiner

DIGITALLY-CALIBRATED CTIA IMAGE SENSOR PIXEL

BACKGROUND OF THE INVENTION

1. Field of the Invention

This application relates generally to image sensors. More specifically, this application relates to a system and method for implementing a capacitive transimpedance amplifier (CTIA) pixel circuit architecture in image sensing applications.

2. Description of Related Art

Image sensing devices typically consist of an image sensor, generally implemented as an array of pixel circuits, as well as signal processing circuitry and any associated control or timing circuitry. Within the image sensor itself, charge is collected in a photoelectric conversion device of the pixel circuit as a result of the impingement of light.

Some existing pixel circuits implement a complementary metal-oxide-semiconductor (CMOS) architecture, in which the transfer of the charge within the pixel circuit and/or to downstream circuitry (e.g., signal processing circuitry) is controlled using one or more metal-oxide-semiconductor field-effect transistors (MOSFETs). A CTIA pixel circuit is one example of a pixel circuit which implements the CMOS architecture.

A CTIA pixel circuit may implement several circuit components within the pixel circuit itself, in addition to the photoelectric conversion device. For example, a CTIA pixel circuit may include a relatively large number of transistors. Moreover, some of these transistors may need to be made large, for example to reduce offset voltage such that the photoelectric conversion device is zero-biased (i.e., the voltage between the anode and the cathode is at or near zero). However, in these implementations the number and size of the transistors may result in the CTIA pixel circuit itself consuming a relatively large amount of physical area, thus presenting difficulties in image sensor miniaturization, pixel density, and the like.

Therefore, there exists a need for a CTIA pixel circuit that may implement a linear zero-biased high conversion gain while consuming less physical area than comparative implementations.

BRIEF SUMMARY OF THE INVENTION

Various aspects of the present disclosure relate to an image sensor, readout circuit therefor, and calibration method thereof.

In one aspect of the present disclosure, there is provided a pixel circuit comprising: a photoelectric conversion device; an amplifier including a first amplifier transistor and a second amplifier transistor connected in series between a first voltage and a second voltage, wherein a gate terminal of the first amplifier transistor is connected to the photoelectric conversion device; a feedback capacitor connected between a first current terminal of the first amplifier transistor and the photoelectric conversion device; a first reset switch connected between the gate terminal of the first amplifier transistor and an anode voltage; and a second reset switch connected between a first current terminal of the second amplifier transistor and a gate terminal of the second amplifier transistor.

In another aspect of the present disclosure, there is provided a method of operating a pixel circuit comprising a photoelectric conversion device, an amplifier including a first amplifier transistor and a second amplifier transistor connected in series between a first voltage and a second voltage, a gate terminal of the first amplifier transistor being connected to the photoelectric conversion device, a feedback capacitor connected between a first current terminal of the first amplifier transistor and the photoelectric conversion device, a first reset switch connected between the gate terminal of the first amplifier transistor and an anode voltage, and a second reset switch connected between a first current terminal of the second amplifier transistor and a gate terminal of the second amplifier transistor, the method comprising: placing the first reset switch in an open state thereof; and subsequently, placing the second reset switch in an open state thereof.

In this manner, the above aspects of the present disclosure provide for improvements in at least the technical field of imaging, as well as the related technical fields of signal processing, image processing, and the like.

This disclosure can be embodied in various forms, including hardware or circuits controlled by computer-implemented methods, computer program products, computer systems and networks, user interfaces, and application programming interfaces; as well as hardware-implemented methods, signal processing circuits, image sensor circuits, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as flowcharts, data tables, and system configurations. It will be readily apparent to one skilled in the art that these specific details are merely exemplary and not intended to limit the scope of this application.

Moreover, while the present disclosure focuses mainly on examples in which the processing circuits are used in image sensors, it will be understood that this is merely one example of an implementation. It will further be understood that the disclosed systems and methods can be used in any device in which there is a need to reduce noise in a signal processing or other analog circuit; for example, an audio signal processing circuit, industrial measurement and systems, and the like. Furthermore, the image sensor implementations described below may be incorporated into an electronic apparatus, including but not limited to a smartphone, a tablet computer, a laptop computer, and the like.

Image Sensor

Figure 1:
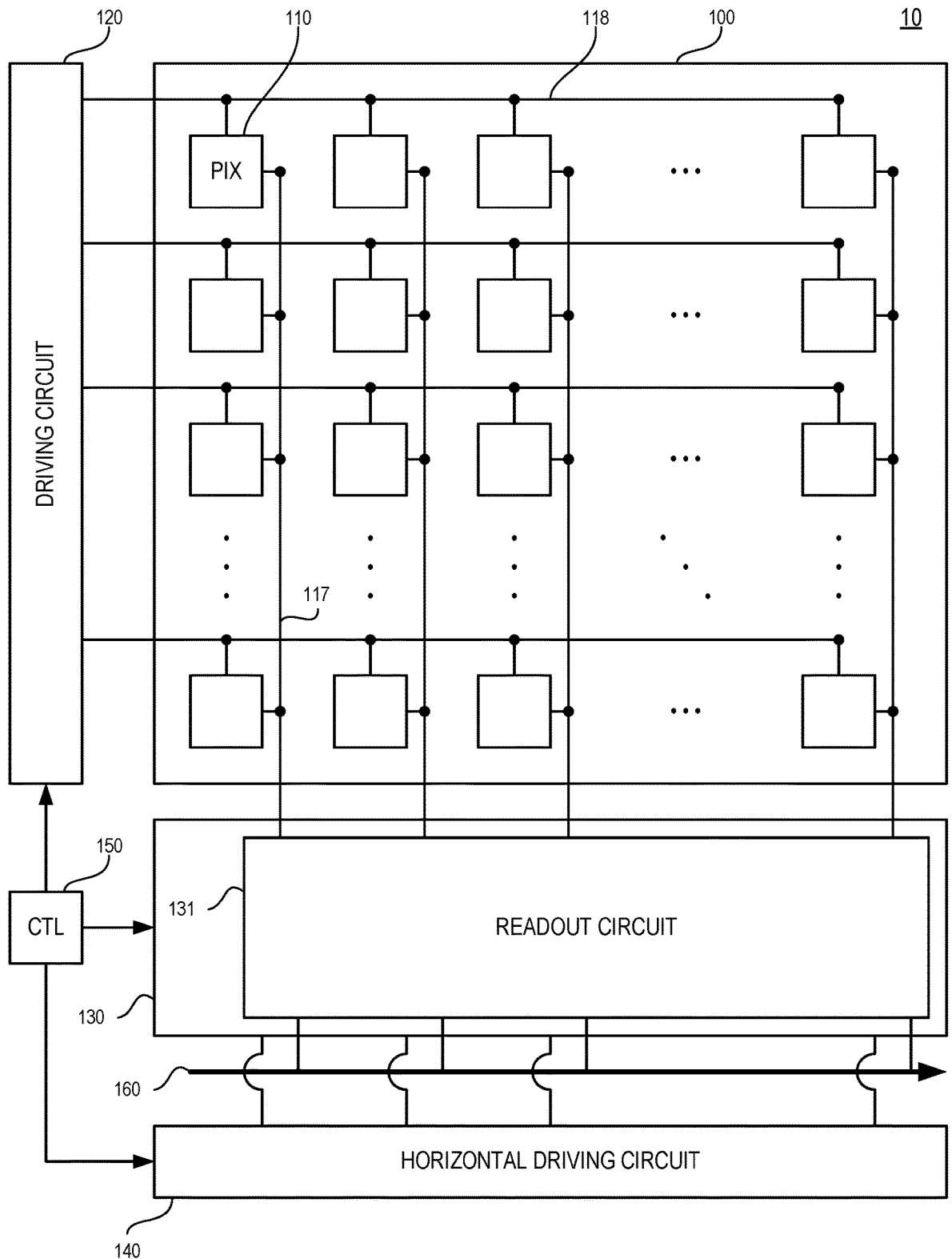
FIG. 1 illustrates an exemplary image sensor according to various aspects of the present disclosure.

FIG. 1 illustrates an image sensor 10 according to various aspects of the present disclosure. Image sensor 10 includes an array 100 of pixel circuits 110. The pixel circuits 110 are located at intersections where horizontal signal lines 118 and vertical signal lines 117 cross one another. The horizontal signal lines 118 are operatively connected to a vertical driving circuit 120, also known as a "row scanning circuit," at a point outside of the pixel array 100, and carry signals from the vertical driving circuit 120 to a particular row of the pixel circuits 110. Pixels in a particular column output an analog signal corresponding to an amount of incident light to the vertical signal line 117. For illustration purposes, only a subset of the pixel circuits 110 are actually shown in FIG. 1; however, in practice the image sensor 10 may have up to tens of millions of pixel circuits ("megapixels" or MP) or more.

The vertical signal line 117 conducts the analog signal for a particular column to a column circuit 130, also known as a "signal processing circuit." While FIG. 1 illustrates one vertical signal line 117 for each column in the pixel array 100, the present disclosure is not so limited. For example, more than one vertical signal line 117 may be provided for each column, or each vertical signal line 117 may correspond to more than one column. In any case, the column circuit 130 preferably includes a readout circuit 131, which may include a plurality of individual sub-circuits and is also known collectively as "readout and ADC circuits". The column circuit 130 including the readout circuit 131 may include various components such as one or more analog amplifiers, ADCs, S/H circuits, and the like. The column circuit is configured to perform one or more signal processing operations on a signal received via the vertical signal line 117, including but not limited to an amplifying operation, an analog-to-digital conversion operation, a sampling operation, a correlated double sampling (CDS) operation, a pixel binning operation, a pixel thinning operation, an output operation, and the like. Various components may operate under the control of a control circuit 150.

CTIA Pixel Circuit

Figure 2:
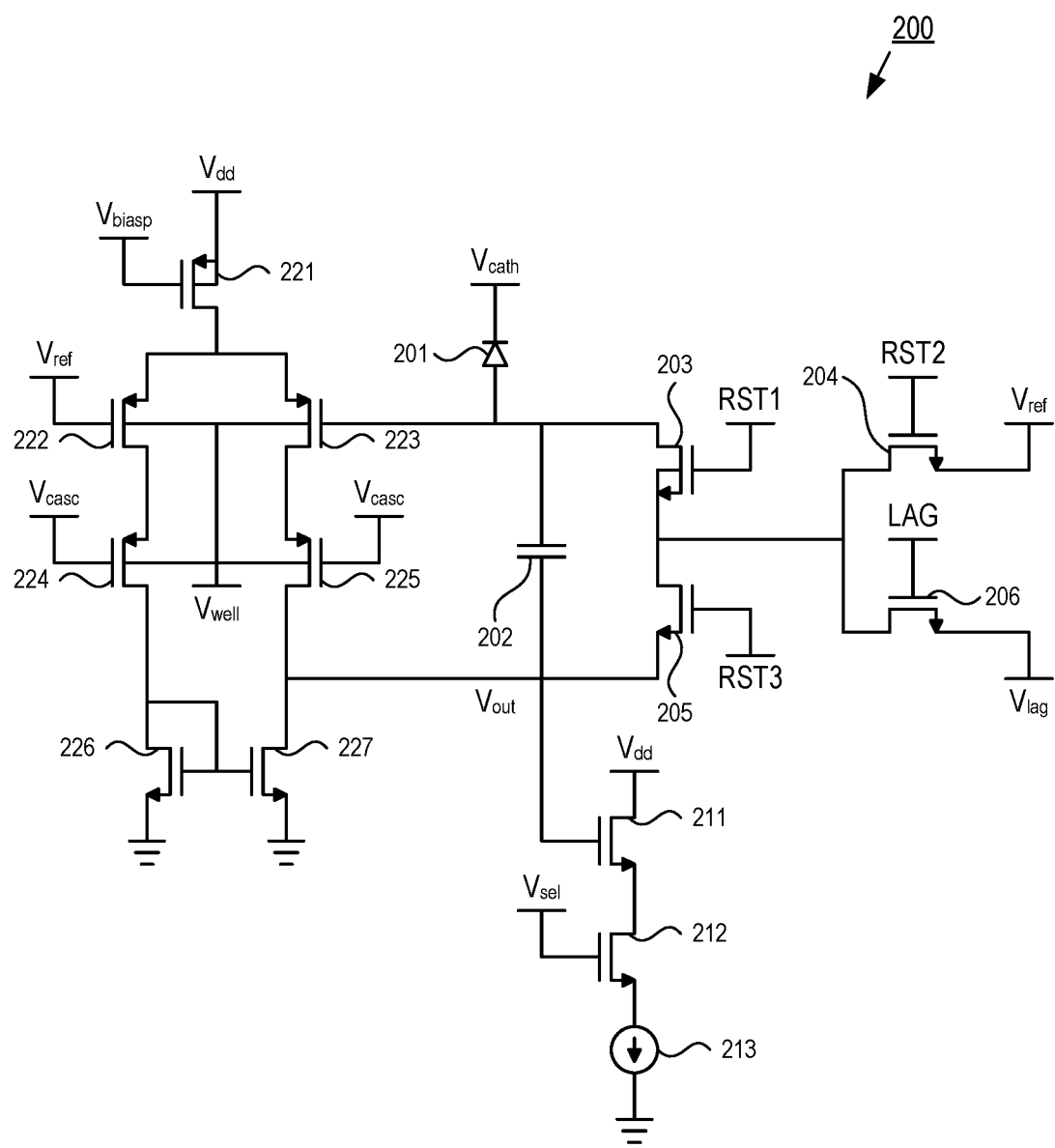
FIG. 2 illustrates an exemplary pixel circuit according to various aspects of the present disclosure.

FIG. 2 illustrates an exemplary pixel circuit 200 having a CTIA architecture and which implements a reset switch network with cascode transistors. The pixel circuit 200 is one example of the pixel circuit 110 illustrated in FIG. 1.

The pixel circuit 200 includes a photoelectric conversion device 201 (e.g., a photodiode); a feedback capacitor 202; a reset switch network including a first reset transistor 203, a second reset transistor 204, a third reset transistor 205, and a fourth reset transistor 206; a source-follower including a source-follower transistor 211 and a selection transistor 212; and a differential amplifier including a tail transistor 221, a first input transistor 222, a second input transistor 223, a first cascode transistor 224, a second cascode transistor 225, a first mirror transistor 226, and a second mirror transistor 227. The pixel circuit 200 integrates a charge on the photoelectric conversion device 201, and outputs a signal $V_{out}$ indicative of the charge. A capacitance may be present across the electrodes of the photoelectric conversion device 201, which may either be a parasitic capacitance of the photoelectric conversion device 201 or a separate capacitor connected in parallel with the photoelectric conversion device 201. In some modified implementations, the pixel circuit 200 may omit some components, such as the selection transistor 212. Moreover, in some implementations the reset switch network may utilize fewer than the four reset transistors illustrated in FIG. 2. For example, the fourth reset transistor 206 may be omitted, or the reset switch network may be replaced with a single reset transistor connected in parallel with the feedback capacitor 202.

As illustrated in FIG. 2, the first reset transistor 203, the second reset transistor 204, the third reset transistor 205, the fourth reset transistor 206, the source-follower transistor 211, the selection transistor 212, the first mirror transistor 226, and the second mirror transistor 227 are implemented as n-type MOS (NMOS) transistors; whereas the tail transistor 221, the first input transistor 222, the second input transistor 223, the first cascode transistor 224, and the second transistor 225 are implemented as p-type MOMS (PMOS) transistors. In practice, however, these conductivity types are not limiting and various ones of the transistors may be implemented using a different conductivity type than that illustrated in FIG. 2.

In the reset switch network of FIG. 2, a body terminal of the first reset transistor 203 is connected to a source terminal of the first reset transistor 203. While not particularly illustrated in FIG. 2, respective body terminals of the second reset transistor 204, the third reset transistor 205, and/or the fourth reset transistor 206 may be grounded. The first reset transistor 203 and the third reset transistor 205 are connected in series across the electrodes of the feedback capacitor 202, such that the source terminal of the first reset transistor 203 is connected to a drain terminal of the third reset transistor 205. A source terminal of the second reset transistor 204 and a source terminal of the fourth reset transistor 206 are connected to a node between the first reset transistor 203 and the third reset transistor 205. A drain terminal of the second reset transistor 204 is connected to the reference voltage $V_{ref}$. A drain terminal of the fourth reset transistor 206 is connected to a lag control voltage $V_{lag}$. Each of the transistors in the reset switch network operates under the control of a corresponding control signal, such that a gate terminal of the first reset transistor 203 receives a first reset signal RST1, a gate terminal of the second reset transistor 204 receives a second reset signal RST2, and a gate terminal of the third reset transistor 205 receives a lag signal LAG.

In the source-follower of FIG. 2, the source-follower transistor 211, the selection transistor 212, and a current source 213 are disposed in series between a power supply voltage $V_{dd}$ and ground. A gate terminal of the selection transistor 212 receives a selection signal $V_{sel}$ to selectively turn the selection transistor 212 on or off. The source-follower transistor 211 receives the output $V_{out}$ at a gate terminal thereof and selectively allows a current to flow via the current source 213, depending on the value of the output $V_{out}$ and the state of the selection transistor 212. The source-follower transistor 211 and the selection transistor 212 are not strictly required, but may help reduce the settling time if implemented.

In the differential amplifier, a body terminal of the tail transistor 221 is connected to a source terminal of the tail transistor 221. In the particular illustration of FIG. 2, respective body terminals of the first input transistor 222, the second input transistor 223, the first cascode transistor 224, and the second cascode transistor 225 are commonly connected with one another and with a well voltage $V_{well}$. The voltage $V_{well}$ is not strictly required to have a particular voltage level, but may be appropriately selected for power supply rejection (PSR) reasons if desired. In alternative implementations, the respective body terminals may be connected to the corresponding source terminals of the transistors or may be connected to the power supply voltage $V_{dd}$. While not particularly illustrated in FIG. 2, respective body terminals of the first mirror transistor 226 and/or the second mirror transistor 227 may be grounded. The source terminal and body terminal of the tail transistor 221 are connected to the power supply voltage $V_{dd}$. On one side of the differential amplifier, the first input transistor 222, the first cascode transistor 224, and the first mirror transistor 226 are connected in series between a drain terminal of the tail transistor 221 and ground. On the other side of the differential amplifier, the second input transistor 223, the second cascode transistor 225, and the second mirror transistor 227 are connected in series between the drain terminal of the tail transistor 221 and ground. A drain terminal of the first mirror transistor 226 is connected to a gate terminal thereof, such that the first mirror transistor 226 is diode-connected. The gate terminal of the first mirror transistor 226 and a gate terminal of the second mirror transistor 227 are connected to one another, thereby to form a current mirror. A gate terminal of the tail transistor 221 receives a biasing signal $V_{biasp}$, a gate terminal of the first input transistor 222 receives the reference voltage $V_{ref}$, a gate terminal of the second input transistor 223 is connected to the feedback capacitor 202 and the photoelectric conversion device 201, and respective gate terminals of the first cascode transistor 224 and the second cascode transistor 225 receive a cascode signal $V_{casc}$.

During an integration state of the pixel circuit 200, the reset signals RST1-RST3 have respective values such that the first reset transistor 203 is in the open state, the second reset transistor 204 is in the closed state, and the third reset transistor 205 is in the open state. In this state, the leakage current is minimized because, ignoring the offset voltage of the differential amplifier 210, the respective voltages on all terminals of the second reset transistor 204 are equal. Because the first reset transistor 203 is source-body tied, the junction component of the leakage current is minimized. Additionally, in this state, the second cascode transistor 225 isolates the anode of the photoelectric conversion device 201 (and thus the gate of the second input transistor 223) from the output of the amplifier. This reduces the LDD-induced voltage-dependent conversion gain and thus allows for a linear high conversion-gain CTIA pixel circuit. The second cascode transistor 225 also increases the gain of the amplifier such that the anode changes to a lesser degree during integration. This results in the photoelectric conversion device 201 being closer to zero-biased relative to a comparative circuit which does not include the second cascode transistor 225.

During a reset state of the pixel circuit 200, the reset signals RST1-RST3 have respective values such that the first reset transistor 203 is in the closed state, the second reset transistor 204 is in the open state, and the third reset transistor 205 is in the closed state. This effectively places the circuit in a unity-gain mode, such that the reference voltage $V_{ref}$ is passed to the output (ignoring offset voltage). The offset may be minimized by appropriately sizing the first input transistor 222, the second input transistor 223, the first mirror transistor 226, and the second input transistor 227. If the voltage $V_{cath}$ on the cathode of the photoelectric conversion device 201 is equal to the reference voltage $V_{ref}$, the photoelectric conversion device 201 is zero-biased during the reset operation.

The pixel circuit 200 implements a cascode transistor layout to increase the gain and to reduce or eliminate INL degradation. For example, a cascoded common-source transistor implementation has larger gain than a single transistor common-source implementation. In particular, the cascoded implementation has a gain of approximately $(g_m \times r_o)^2$ whereas the single transistor implementation has a gain of approximately $(g_m \times r_o)$, where $g_m$ represents the transconductance of the transistor and $r_o$ represents the output resistance of the transistor.

Digitally-Calibrated CTIA Pixel Circuit

In some implementations, the physical area consumed by the pixel circuit 200 illustrated in FIG. 2 may be undesirably large. For example, the relatively large number of transistors in the pixel circuit 200 may occupy a large amount of space. Additionally, some implementations may require the first input transistor 222, the second input transistor 223, the first mirror transistor 226, and/or the second mirror transistor 227 to be made large in order to reduce the offset voltage such that the difference between the anode and cathode of the photoelectric conversion device 201 is as close to zero as possible (i.e., in order to make the photoelectric conversion device 201 zero-biased). In such instances, a digitally-calibrated CTIA pixel may be used.

Figure 3:
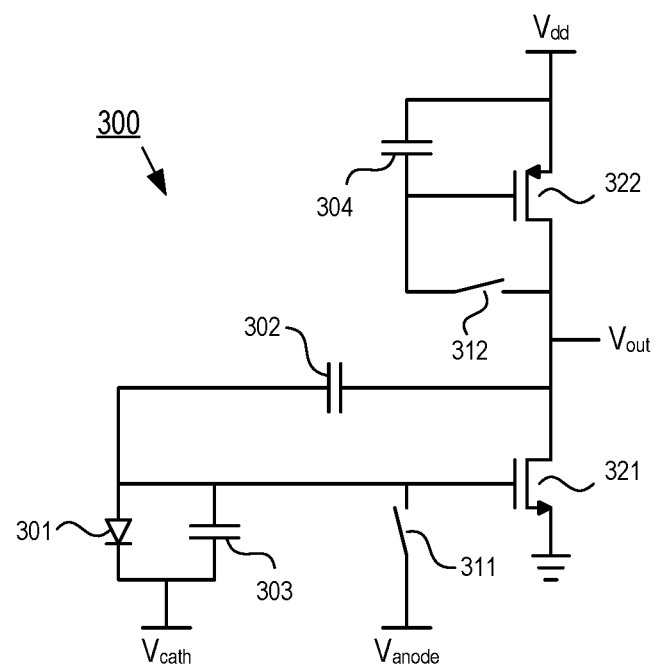
FIG. 3 illustrates another exemplary pixel circuit according to various aspects of the present disclosure.
Figure 4:
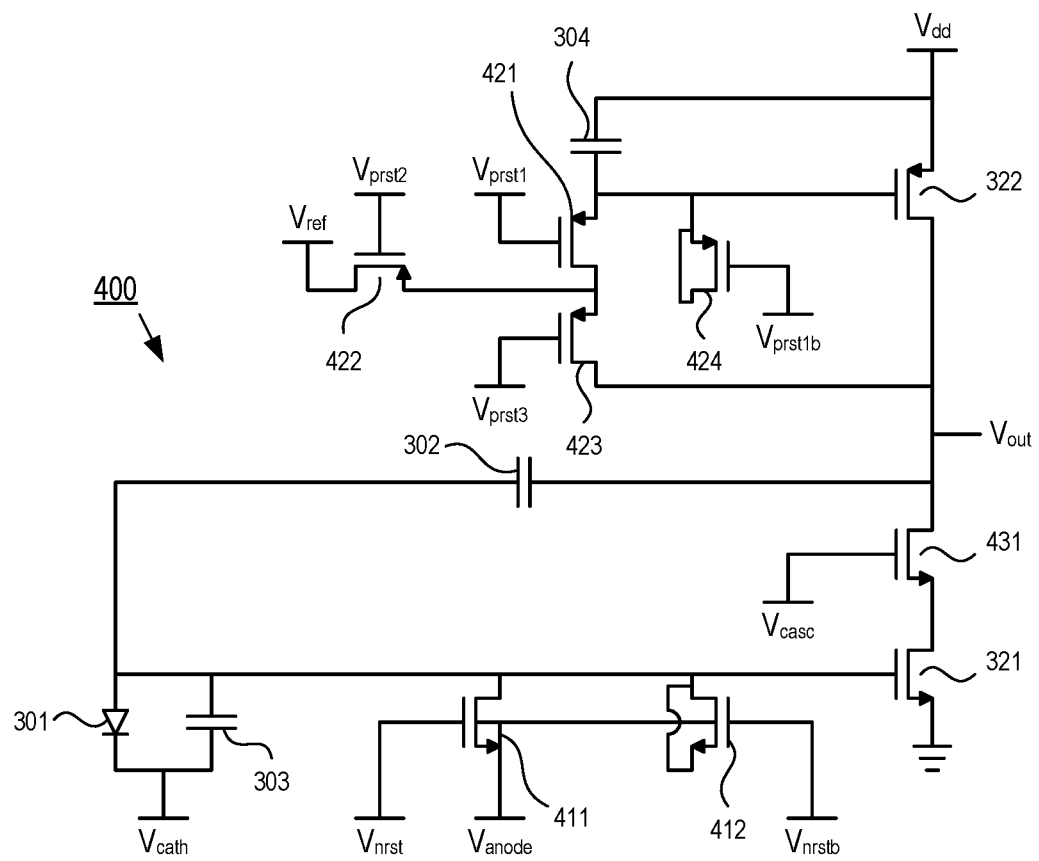
FIG. 4 illustrates an exemplary transistor-level implementation of the exemplary pixel circuit of FIG. 3.

FIG. 3 illustrates an exemplary pixel circuit 300 in accordance with the present disclosure, which implements a CTIA architecture and is digitally-calibrated. FIG. 4 illustrates a transistor-level implementation of the pixel circuit 300. The pixel circuit 300 is one example of the pixel circuit 110 illustrated in FIG. 1.

The pixel circuit 301 includes a photoelectric conversion device 301 (e.g., a photodiode), a feedback capacitor 302, a conversion capacitor 303 connected in parallel with the photoelectric conversion device 301 (which may be a parasitic capacitance of the photoelectric conversion device 301 or may be a separate capacitor), a holding capacitor 304, a first reset switch 311, a second reset switch 312, a first amplifier transistor 321, and a second amplifier transistor 322. The pixel circuit 300 integrates a charge on the photoelectric conversion device 301, and outputs a signal $V_{out}$ indicative of the charge. In some implementations, a source follower may be connected to the output node, in a similar manner to the source-follower transistor 211 and (where present) the selection transistor 212 illustrated in FIG. 2.

A gate terminal of the first amplifier transistor 321 is connected to an anode of the photoelectric conversion device 301. The first reset switch 311 is also connected to the gate terminal of the first amplifier transistor 321 and the anode of the photoelectric conversion device 301 to selectively supply a voltage $V_{anode}$ thereto. The feedback capacitor 302 is connected between a drain terminal and the gate terminal of the first amplifier transistor 321. The second reset switch 312 is connected between a gate terminal and a drain terminal of the second amplifier transistor 322. The holding capacitor 304 is connected between the gate terminal and a source terminal of the first amplifier transistor 321. The first amplifier transistor 321 and the second amplifier transistor 322 are connected in series between ground and a power supply voltage $V_{dd}$. In some implementations, one example of which will be discussed in more detail below with reference to FIG. 5, the ground may instead be a bias provided by a bias voltage control circuit or a bias current control circuit. The signal $V_{out}$ is output from a node between the first amplifier transistor and the second amplifier transistor 322.

The first reset switch 311 and the second reset switch 312 may be implemented using one or more transistors, as illustrated in FIG. 4. As illustrated in FIG. 4, the first reset switch 311 is implemented as a first reset transistor 411 and a first dummy transistor 412 (e.g., as a charge injection cancelation switch). In some implementations, the first dummy transistor 412 may be omitted. A drain terminal of the first reset transistor 411 and a drain terminal of the first dummy transistor 412 are connected to the gate terminal of the first amplifier transistor 321 and the anode of the photoelectric conversion device 301. A source terminal of the first reset transistor 411 is connected to the voltage $V_{anode}$ and to a body terminal of the first reset transistor 411. A source terminal of the first dummy transistor 412 is connected to the drain terminal of the first dummy transistor 412. The body terminal of the first reset transistor 411 is connected to a body terminal of the first dummy transistor 412. A gate terminal of the first reset transistor 411 receives a control signal $V_{nrst}$ and a gate terminal of the first dummy transistor 412 receives a control signal $V_{nrstb}$.

The second reset switch 312 is implemented as a reset switch network including a second reset transistor 421, a third reset transistor 422, and a fourth reset transistor 423. The second reset transistor 421 and the fourth reset transistor 423 are connected in series between the gate terminal and the drain terminal of the second amplifier transistor 322, such that a drain terminal of the second reset transistor 421 is connected to a source terminal of the fourth reset transistor 423. A source terminal of the third reset transistor 422 is connected to a node between the second reset transistor 421 and the fourth reset transistor 423, and a drain terminal of the third reset transistor 422 is connected to a reset voltage $V_{ref}$. While not particularly illustrated in FIG. 4, the respective body terminals may be connected in a manner similar to that of FIG. 2; that is, a body terminal of the second reset transistor 421 may be connected to a source terminal of the second reset transistor 421, and respective body terminals of the third reset transistor 422 and/or the fourth reset transistor 423 may be grounded. Each of the transistors in the reset switch network operates under the control of a corresponding control signal, such that a gate terminal of the second reset transistor 421 receives a first reset signal $V_{prst1}$, a gate terminal of the third reset transistor 422 receives a second reset signal $V_{prst2}$, and a gate terminal of the fourth reset transistor 423 receives a third reset signal $V_{prst3}$.

A second dummy transistor 424 may also be provided in some implementations (e.g., as a charge injection cancelation switch), with both a source terminal and a drain terminal of the second dummy transistor 424 being connected to the gate terminal of the second amplifier transistor 322. In other implementations, however, the second dummy transistor 424 may be omitted. When implemented, a gate terminal of the second dummy transistor 424 receives a signal $V_{prst1b}$. The cascode transistor 431 is connected between the first amplifier transistor 321 and the second amplifier transistor 322 and, more particularly, between the first amplifier transistor 321 and the output node. A gate terminal of the cascode transistor 431 receives a signal $V_{casc}$.

The rise and fall times of the driving signals across the image sensor will vary in practice. Therefore, while the inclusion of the first dummy transistor 412 and the second dummy transistor 424 is not strictly necessary, they may be implemented to account for this variation. The cascode transistor 431 is also not strictly necessary, but may be added to increase gain and reduce the impacts on the conversion gain of the lightly doped drain (LDD) of the first amplifier transistor 321. Moreover, in some implementations the holding capacitor 304 may not be a separate capacitor, but may instead represent the gate capacitance of the second amplifier transistor 322.

As illustrated in FIG. 4, the first amplifier transistor 321, the first reset transistor 411, the first dummy transistor 412, and the cascode transistor 431 are implemented as NMOS transistors; whereas the second amplifier transistor 322, the second reset transistor 421, the third reset transistor 422, the fourth reset transistor 423, and the second dummy transistor 424 are implemented as PMOS transistors. In practice, however, these conductivity types are not limiting and various ones of the transistors may be implemented using a different conductivity type than that illustrated in FIG. 4.

All of the switches illustrated in FIG. 4 may be implemented with a minimal size with the exception of the first reset transistor 411, which may be twice the minimal size to allow for charge injection cancelation. The second reset transistor 421 and the fourth reset transistor 423 can both be implemented with the minimal size if the fourth reset transistor 423 opens before the second reset transistor 421. This ordering will allow the second dummy transistor 424 to cancel charge.

The zero-biased digitally-calibrated single-ended input pixel illustrated in FIGS. 3-4 may be operated as follows. For purposes of explanation, it will be assumed that $V_{anode}=V_{cathode}$ and that the following operations are performed in a dark environment (i.e., in the absence of ambient light). Moreover, for purposes of explanation, the operation of the reset switches will be described with respect to their general form (illustrated in FIG. 3) as opposed to the transistor-level implementation (illustrated in FIG. 4).

During a reset operation, the first reset switch 311 and the second reset switch 312 are closed. As a result, the output $V_{out}$ is equivalent to $V_{anode}$ (and thus also to $V_{cathode}$) and the circuit is zero-biased during reset. Next, the first reset switch 311 is opened. Charge injection and charge feedthrough from the first reset switch 311 will cause $V_{anode}$ to change such that it is no longer equivalent to $V_{cathode}$ (i.e., the photoelectric conversion device 301 is no longer zero-biased). Thereafter, the second reset switch 312 is opened. Charge injection and charge feedthrough from the second reset switch 312 will indirectly cause $V_{anode}$ to further change, therefore making the photoelectric conversion device 301 even less zero-biased. After both the first reset switch 311 and the second reset switch 312 have been opened, all of the pixel circuits in the image sensor are measured to collect an image. If the resulting image is indicative of the pixel circuits being zero-biased (e.g., if the ADC codes are zero or near-zero), no further operation is necessary at this time. However, if the resulting image is not so indicative, $V_{anode}$ is adjusted and the operations are repeated beginning with the reset operation. This operations may be performed by a control circuitry of the image sensor (e.g., the driving circuit 120 and/or the control circuit 150 illustrated in FIG. 1).

By this digital calibration process, $V_{anode}$ is iteratively adjusted to cancel out the impact of charge injection, charge feedthrough, transistor offset, and the like. Because the first reset switch 311 is opened before the second reset switch 312 is opened, it may be possible to ensure a relatively well-defined starting point for the output $V_{out}$ in the integration state. If the order of opening the reset switches were transposed, it may become difficult to define the starting point of the output $V_{out}$.

Pixel Bias Control Circuit

While FIGS. 3-4 illustrate an implementation in which a source terminal of the first amplifier transistor 321 is connected to a ground voltage, in practice the voltage applied to the first amplifier transistor 321 may be controlled. This control may be effected by a pixel bias control circuit.

Figure 5:
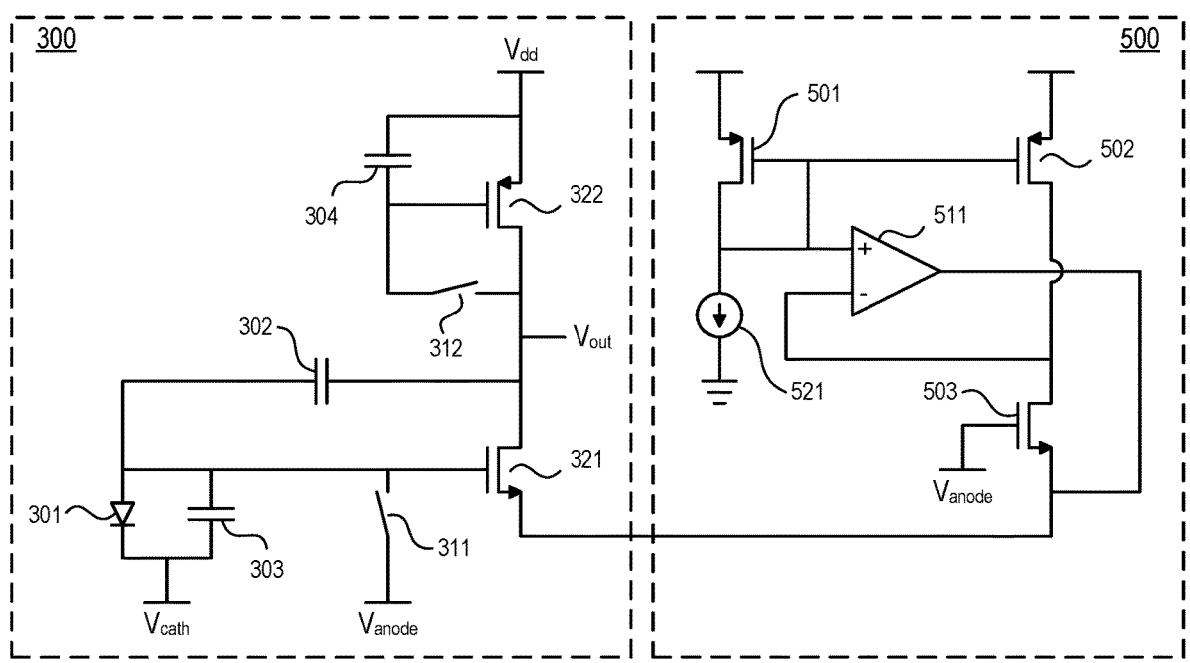
FIG. 5 illustrates an exemplary pixel bias control circuit according to various aspects of the present disclosure.

FIG. 5 illustrates one example, in which a pixel circuit 300 is supplied with a bias current from a pixel bias control circuit 500. For purposes of illustration, FIG. 5 illustrates only a single pixel circuit 300 corresponding to the pixel bias control circuit 500, in practice the pixel bias control circuit 500 may control more than one pixel circuit. For example, a single pixel bias control circuit 500 may control all pixel circuits in the pixel array. The elements of the pixel circuit 300 generally correspond to those described above with regard to FIG. 3, and thus a full explanation thereof is not repeated here.

The pixel bias control circuit 500 includes a current mirror formed by a first mirror transistor 501 and a second mirror transistor 502, an anode control transistor 503, a differential amplifier 511, and a current source 521. In the particular illustration of FIG. 5, the current mirror is implemented using PMOS components whereas the anode control transistor 503 and the current source 521 are implemented using NMOS components. As above, however, the conductivity types of the transistors are not particularly limited. This architecture acts similar to a linear regulator and allows the pixel bias current to be well-controlled.

Because the offset is being effectively calibrated, the amplifier transistors in the implementation of FIG. 5—that is, the first amplifier transistor 321, the second amplifier transistor 322, and the cascode transistor 431 (see FIG. 4)—may be made smaller compared to their counterparts in the implementation of FIG. 3.

CONCLUSION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A pixel circuit, comprising:
   a photoelectric conversion device;
   an amplifier including a first amplifier transistor and a second amplifier transistor connected in series between a first voltage and a second voltage, wherein a gate terminal of the first amplifier transistor is connected to the photoelectric conversion device;
   a feedback capacitor connected between a first current terminal of the first amplifier transistor and the photoelectric conversion device;
   a first reset switch connected between the gate terminal of the first amplifier transistor and an anode voltage; and
   a second reset switch connected between a first current terminal of the second amplifier transistor and a gate terminal of the second amplifier transistor.

2. The pixel circuit according to claim 1, further comprising:
   control circuitry configured to control the first reset switch and the second reset switch such that, during a calibration operation, the first reset switch is placed in an open state thereof and subsequently the second reset switch is placed in an open state thereof.

3. The pixel circuit according to claim 2, wherein the control circuitry is configured to measure an output of the pixel circuit in a state where the first reset switch and the second switch are in the open states thereof, and to modify the anode voltage based on a measurement result.

4. The pixel circuit according to claim 3, wherein the control circuitry is configured to modify the anode voltage such that the photoelectric conversion device is zero-biased.

5. The pixel circuit according to claim 1, wherein the first reset switch includes a first reset transistor.

6. The pixel circuit according to claim 5, wherein the first reset switch includes a first dummy transistor, and a body terminal of the first reset transistor is connected to a body terminal of the first dummy transistor.

7. The pixel circuit according to claim 1, wherein the second reset switch includes a second reset transistor, a third reset transistor, and a fourth reset transistor.

8. The pixel circuit according to claim 7, wherein the second reset transistor and the fourth reset transistor are connected in series between the gate terminal of the second amplifier transistor and the first current terminal of the second amplifier transistor.

9. The pixel circuit according to claim 8, wherein the third reset transistor is connected between a reference voltage and a node, and wherein the node is located between the second reset transistor and the fourth reset transistor.

10. The pixel circuit according to claim 7, wherein the second reset switch includes a second dummy transistor connected to the gate terminal of the second amplifier transistor.

11. The pixel circuit according to claim 1, further comprising a cascode transistor disposed between the first amplifier transistor and the second amplifier transistor.

12. The pixel circuit according to claim 1, further comprising a holding capacitor disposed between a second current terminal of the second amplifier transistor and the gate terminal of the second amplifier transistor.

13. The pixel circuit according to claim 1, wherein the first voltage is a power supply voltage.

14. The pixel circuit according to claim 1, further comprising a bias control circuit configured to generate the second voltage.

15. The pixel circuit according to claim 14, wherein the bias control circuit includes a current mirror, a differential amplifier, and a current source.

16. The pixel circuit according to claim 1, wherein the pixel circuit is configured to integrate a charge on the photoelectric conversion device and to output a signal indicative of the charge from an output node.

17. The pixel circuit according to claim 16, wherein the output node is located between the first amplifier transistor and the second amplifier transistor.

18. A method of operating a pixel circuit comprising a photoelectric conversion device, an amplifier including a first amplifier transistor and a second amplifier transistor connected in series between a first voltage and a second voltage, a gate terminal of the first amplifier transistor being connected to the photoelectric conversion device, a feedback capacitor connected between a first current terminal of the first amplifier transistor and the photoelectric conversion device, a first reset switch connected between the gate terminal of the first amplifier transistor and an anode voltage, and a second reset switch connected between a first current terminal of the second amplifier transistor and a gate terminal of the second amplifier transistor, the method comprising:

placing the first reset switch in an open state thereof; and subsequently, placing the second reset switch in an open state thereof.

19. The method according to claim 18, further comprising:

measuring an output of the pixel circuit in a state where the first reset switch and the second switch are in the open states thereof; and modify the anode voltage based on a measurement result.

20. The method according to claim 19, wherein the modifying the anode voltage is performed such that the photoelectric conversion device is zero-biased.

* * * * *